United States Patent
Wu

[19]

[11] Patent Number: 5,915,182
[45] Date of Patent: Jun. 22, 1999

[54] MOSFET WITH SELF-ALIGNED SILICIDATION AND GATE-SIDE AIR-GAP STRUCTURE

[75] Inventor: Shye-Lin Wu, Hsinchu, Taiwan

[73] Assignee: Texas Instruments - Acer Incorporated, Hsinchu, Taiwan

[21] Appl. No.: 08/953,609

[22] Filed: Oct. 17, 1997

[51] Int. Cl.[6] .................................................. H01L 21/336
[52] U.S. Cl. ...................... 438/299; 438/305; 438/595; 438/563
[58] Field of Search ..................... 438/299, 305, 438/306, 307, 301, 303, 595, 683, FOR 174, FOR 182, FOR 185, FOR 188, 563

[56] References Cited

U.S. PATENT DOCUMENTS

| | | | |
|---|---|---|---|
| 4,477,962 | 10/1984 | Godejahn, Jr. ........................... | 438/301 |
| 4,577,392 | 3/1986 | Peterson ................................... | 438/305 |
| 5,391,508 | 2/1995 | Matsuoka et al. ....................... | 438/305 |
| 5,504,024 | 4/1996 | Hsu .......................................... | 438/305 |
| 5,736,446 | 4/1998 | Wu ........................................... | 438/305 |
| 5,766,969 | 6/1998 | Fulford, Jr. et al. ..................... | 438/305 |
| 5,770,507 | 6/1998 | Chen et al. .............................. | 438/305 |
| 5,780,350 | 7/1998 | Kapoor ..................................... | 438/305 |

FOREIGN PATENT DOCUMENTS 1-105532  4/1989  Japan .

OTHER PUBLICATIONS

Kyoji Yamashita et al., "Impact of the Reduction of the Gate to Drain Capacitance on Low Voltage Operated CMOS Devices", 1995, Symposium on VLSI Technology Digest of Technical Papers, pp. 69–70.

Togo et al, "A Gate–Side Air–gap Structure (GAS) to reduce the Parasitic Capacitance in MOSFETs", 1996 Symposium on VLSI Tech. Digest of Technical Papers, pp. 38–39.

Ruth DeJule, "Meeting the Ultra–Shallow Junction Challenge", Apr. 1997, Semiconductor International 50–54, 56.

*Primary Examiner*—Michael Trinh
*Attorney, Agent, or Firm*—Harness, Dickey & Pierce, P.L.C.

[57] ABSTRACT

The method of the present invention includes forming a silicon dioxide layer. A polysilicon layer is then deposited on the silicon dioxide layer. Next, a gate structure is formed by etching. A silicon oxynitride layer is formed on the substrate and covers the gate structure. Silicon nitride side-wall spacers are formed on the side walls of the gate. An amorphous silicon layer is formed on the substrate, the side-wall spacers, and top of the polysilicon gate. Then, the source and the drain are formed. A wet oxidation is subsequently carried out to convert the amorphous silicon into a doped oxide layer. An etching process is then utilized to etch the oxide layer. Therefore, oxide side-wall spacers are formed on the silicon nitride side-wall spacers. Then, a metal silicide layer is formed on top of the gate, and on the source and the drain. The silicon nitride side-wall spacers are removed to form air gaps between the gate and the side-wall spacers. Then, a low energy pocket ion implantation is performed to doped ions into the substrate via the air gaps. Next, an oxide is formed on the substrate, spacers and over the gate. Then, a rapid thermal process (RTP) is carried out for annealing.

21 Claims, 3 Drawing Sheets

MOSFET WITH SELF-ALIGNED SILICIDATION AND GATE-SIDE AIR-GAP STRUCTURE

The present invention relates to a semiconductor device, and, more specifically, to a method of fabricating a metal oxide semiconductor field effect transistor (MOSFET).

BACKGROUND OF THE INVENTION

With the advent of Ultra Large Scale Integrated (ULSI) technologies, the sizes of semiconductor devices and smaller than ever, which results in the packing density of a wafer being continuously increased. For example, this has caused a reduction in capacitor area, which in turn results in a reduction in cell capacitance. However, some problems occur due to the scaled down size of a device. For example, as the size of a capacitor decreases, the capacitance of the capacitor also decreases and the amount of the charge capable of being stored by the capacitor similarly decreases. This results in the capacitor being very susceptible to α particle interference and the charge held by the storage capacitor must be refreshed often.

Metal oxide semiconductor field effect transistors (MOSFETs) have been traditionally used and widely applied in the semiconductor technologies. As the trend of the integrated circuits, the fabrication of the MOSFET also meets various issues such as short channel effect. One of the issues is hot carriers that will inject into gate oxide, which is overcome by the development of the lightly doped drain (LDD) structure. Parasitic capacitance is a main reason to degrade the speed of the MOSFET, as it also causes high power for operating the devices. Typically, reasons to generate parasitic capacitance are the gate capacitance, gate-to-drain overlap capacitance, the junction capacitance and gate fringe capacitance.

The requirement of the ULSI technology is the need for devices capable of being operated at low supply voltage and having high speed. Thus, minimizing the parasitic capacitance is a key way to achieve high speed and low power devices for ULSI. See "Impact of Reduction of Gate to Drain Capacitance on Low Voltage Operated CMOS Devices, Kyoji Yamashita et al., 1995, Symposium on VLSI Technology Digest of Technical Papers.". Prior art approaches to overcoming these problems have resulted in the development of the gate-side air-gap (GAS) structure to reduce the parasitic capacitance in MOSFET. Please see "A Gate-side Air-gap Structure (GAS) to Reduce the Parasitic Capacitance in MOSFETs, M. Togo et al., 1996, Symposium on VLSI Technology Digest of Technical Papers. High speed and low power operation devices are achieved by using the GAS structure in MOSFETs, which effectively reduces the gate fringe capacitance of the MOSFETs. However, it is difficult to reduce the valve of fringing field capacitance ($C_{FR}$), due to the difficulty of scaling down the dielectric spacer thickness while scaling down the device dimension. The CRF becomes more important as the gate length is reduced to deep sub micron-meter range.

SUMMARY OF THE INVENTION

The method of the present invention includes forming a silicon dioxide layer on the substrate to serve as a gate oxide. A polysilicon layer is then deposited on the silicon dioxide layer. Next, lithography and etching steps are used to form a gate structure. Subsequently, a silicon oxynitride layer is formed on the substrate which covers the gate structure. Silicon nitride side-wall spacers are formed on the side walls of the gate. An amorphous silicon layer is formed on the substrate, the side-wall spacers, and the top of the polysilicon gate. Then, active regions (i.e. the source and the drain) are formed by using well known ion implantation. The amorphous silicon layer acts as a buffer to prevent the substrate from damage during the ion implantation.

A wet oxidation is subsequently carried out to convert the amorphous silicon into a doped oxide layer. Simultaneously, the ions in the original amorphous layer will diffuse into the substrate, thereby forming a lightly doped drain (LDD) adjacent to the drain.

An etching process is then utilized to etch the oxide layer. Therefore, oxide side-wall spacers are formed on the silicon nitride side-wall spacers. Then, a metal silicide layer is formed on top of the gate, on the source and the drain. The silicon nitride side-wall spacers are removed and form air gaps between the gate and the side-wall spacers. Then, a low energy pocket ion implantation is performed to doped ions in the substrate via the air gaps. Next, an oxide is formed by chemical vapor deposition on the substrate, spacers and over the gate. Then, a rapid thermal process (RTP) is carried out for annealing.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
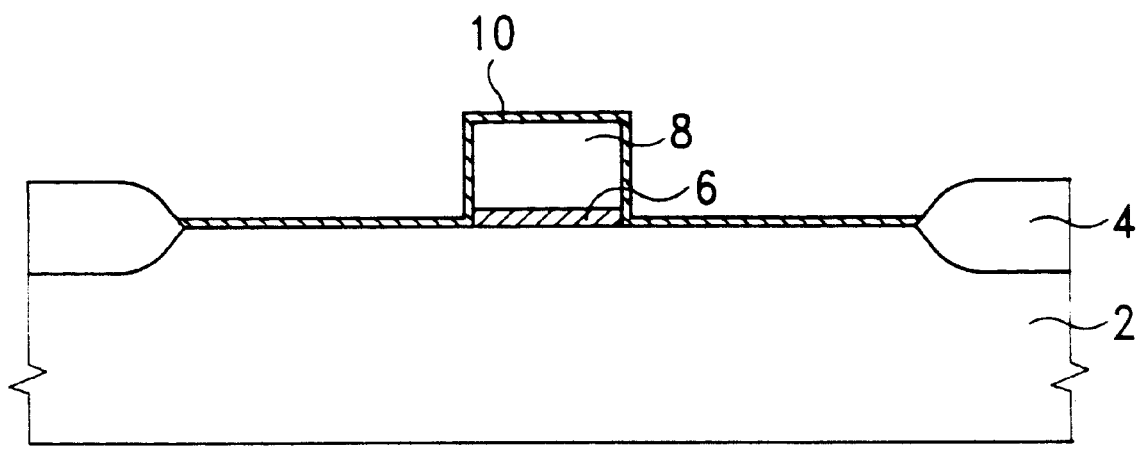
FIG. 1 is a cross-sectional view of a semiconductor wafer illustrating the steps of forming a gate structure and forming a silicon oxynitride layer on a semiconductor substrate according to the present invention.

In a preferred embodiment, a single crystal silicon substrate 2 with a <100> crystallographic orientation is provided. A thick field oxide (FOX) regions 4 are formed to provide isolation between devices on the substrate. For example, the FOX regions 4 can be formed via lithography and etching steps to etch a silicon nitride-silicon dioxide composition layer. After the photoresist is removed and wet cleaned, thermal oxidation in an oxygen-steam environment is used to grow the FOX regions 4 to a thickness of about 3000–8000 angstroms. The FOX regions 4 can be replaced by a plurality of shallow trench isolations, as is well known in the art.

Next, a silicon dioxide layer 6 is created on the top surface of the substrate 2 to serve as a gate oxide of a subsequently formed MOSFET. Typically, the silicon dioxide layer 6 is formed in an oxygen ambient at a temperature of about 800° to 1100° Centigrade. In this embodiment, the thickness of the silicon dioxide layer 6 is approximately 30–200 angstroms. Alternatively, the oxide layer 6 may be formed using any suitable oxide chemical compositions and procedures.

A polysilicon layer 8 is then deposited on the FOX regions 4 and the silicon dioxide layer 6 using a low pressure chemical vapor deposition process. In this embodiment, the thickness of the polysilicon layer 8 is about 500 to 2000 angstroms. Next, standard lithography and etching steps are used to etch the silicon oxide 4 and the polysilicon layer 8 for forming a gate structure consisting of the gate oxide 6 and the polysilicon 8. Subsequently, a silicon oxynitride layer 10 is formed on the substrate 2, and substantially conformally covers the gate structure 6, 8. In this case, the silicon oxynitride layer 10 is formed by thermal oxidation in an $N_2O$ environment. The temperature for forming the silicon oxynitride layer 10 ranges from 700° to 1150° Centigrade. As is well known in the art, the etching to pattern the gate structure will cause substrate damage. Thus, the thermal oxidation used to form the silicon oxynitride layer 10 on the substrate 2 can recover the etching damage.

Figure 2:
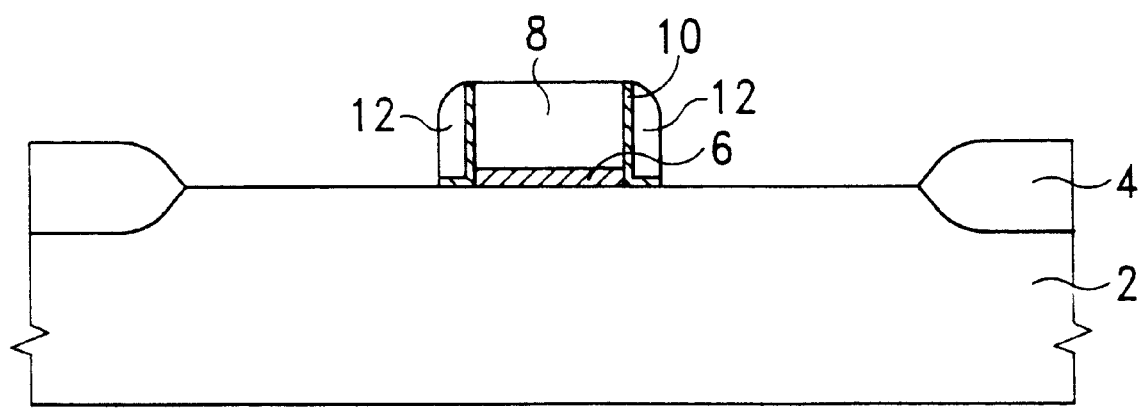
FIG. 2 is a cross-sectional view of a semiconductor wafer illustrating the step of forming silicon nitride side-wall spacers according to the present invention.

Turning to FIG. 2, silicon nitride side-wall spacers 12 are formed on the side walls of the gate 8. In order to achieve this, an anisotropical etching is performed followed by depositing a silicon nitride layer 12 on the silicon oxynitride layer 10. The first portion of the silicon oxynitride layer 10 on the top of the polysilicon gate 8 is removed by the etching, therefore, the top of the gate 8 is exposed. A second portion of the silicon oxynitride layer 10 remains between the gate polysilicon 8 and the side-wall spacers 12. Similarly, a third portion of the side-wall spacers 12 laid under the side-wall spacers 12 also remains on the substrate 2.

Figure 3:
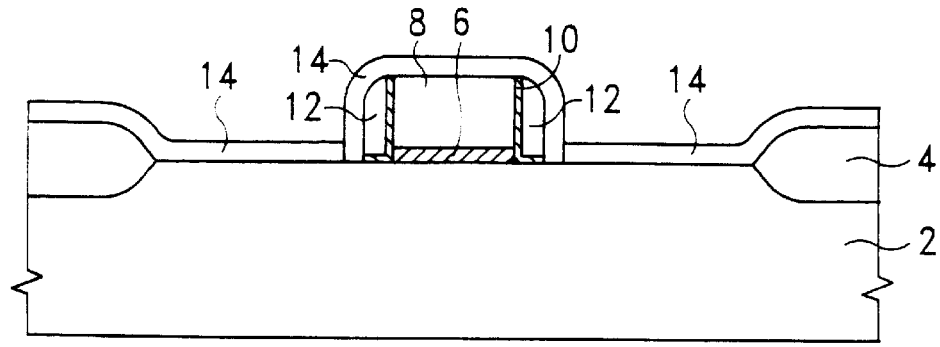
FIG. 3 is a cross-sectional view of a semiconductor wafer illustrating the step of forming an amorphous silicon over the substrate according to the present invention.
Figure 4:
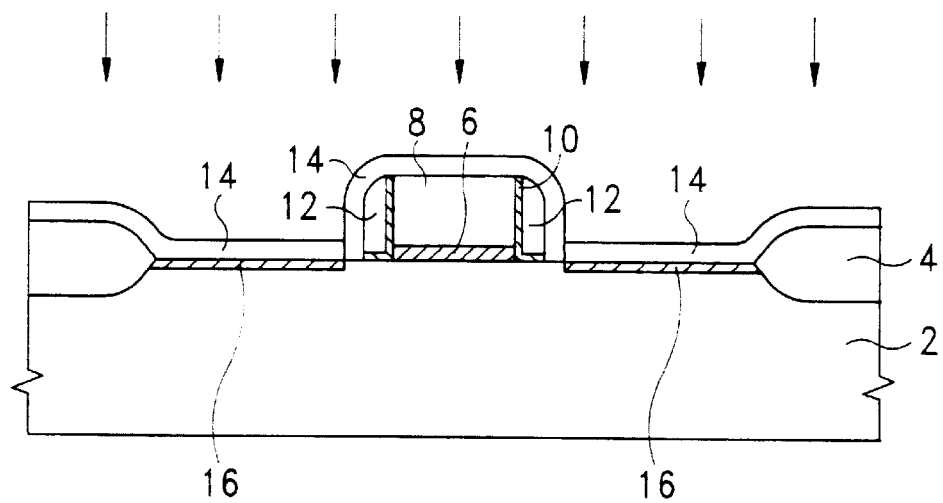
FIG. 4 is a cross-sectional view of a semiconductor wafer illustrating the step of performing an ion implantation to form the source and drain according to the present invention.

Turning to FIG. 3, a thin amorphous silicon layer 14 is conformally formed on the substrate 2, the side-wall spacers 12, and the top of the polysilicon gate 8. The thickness of the amorphous silicon layer 14 is about 100 to 1000 angstroms. Active regions (i.e. the source and the drain) 16 are formed by using well known ion implantation to implant appropriate impurities through the amorphous silicon layer 14 into those regions 16. The amorphous silicon layer 14 acts as a buffer to prevent the substrate 2 from damage during the ion implantation. The gate 8 is also implanted with the ions to increase its conductivity, as shown in FIG. 4. The dosage and the implantation energy of the step are respectively about 5E14 to 2E16 atoms/$cm^2$, about 5 to 120 KeV.

Figure 5:
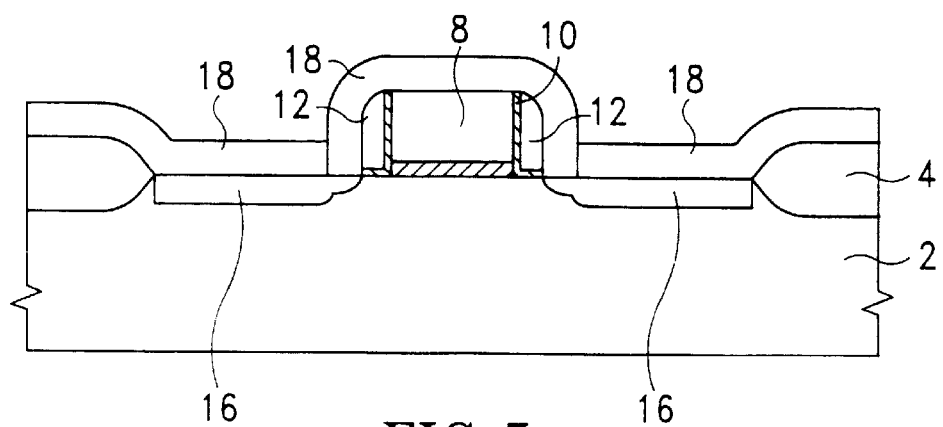
FIG. 5 is a cross-sectional view of a semiconductor wafer illustrating the step of performing a wet oxidation according to the present invention.

Referring to FIG. 5, a wet oxidation is subsequently carried out to convert the amorphous silicon 14 into a doped oxide layer 18. Simultaneously, the ions in the original amorphous layer 14 will diffuse into the substrate 2, thereby forming a lightly doped drain (LDD) 19 adjacent to the drain 16. Further, the source and the drain 16 are also expanded due to the ions being driven more deeply into the substrate 2 by the oxidation. The buffer layer is converted by wet oxidation at a temperature of about 700° to 1100° Centigrade.

Figure 6:
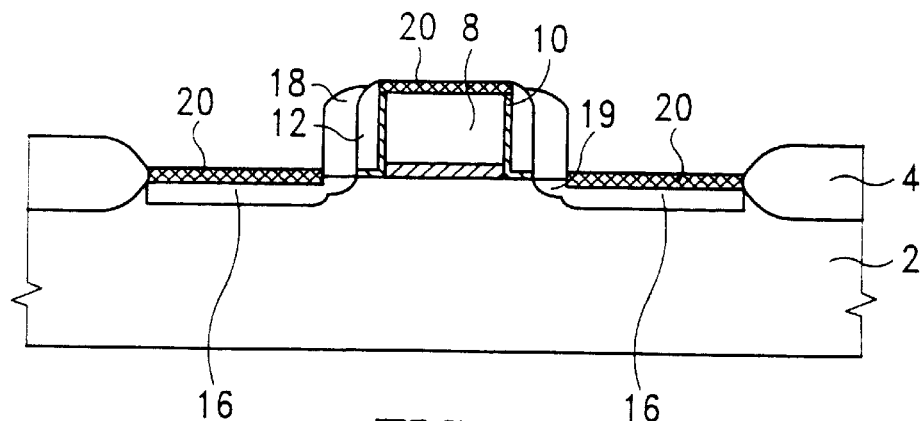
FIG. 6 is a cross-sectional view of a semiconductor wafer illustrating the step of performing an etching to form oxide side-wall spacers according to the present invention.

Turning now to FIG. 6, an etching process is utilized to anisotropically etch the oxide layer 18. Oxide side-wall spacers 18 are formed on the side-wall spacers 12. Then, a metal silicide layer 20 is formed on top of the gate 8, and on the source and the drain 16. In this embodiment, a metal layer such as Ti, Pt, Co, W is sputtered on the source and drain 16, on the gate 8, and on the side-wall spacers 18. Then, a thermal process is used to react the metal layer with the substrate 2 and the polysilicon gate 8. Then, the non-reaction portion of the metal layer is removed. Thus, a metal silicide layer 20 is self-aligned formed on the desired region, that is the source and drain 16, and polysilicon gate 8.

Figure 7:
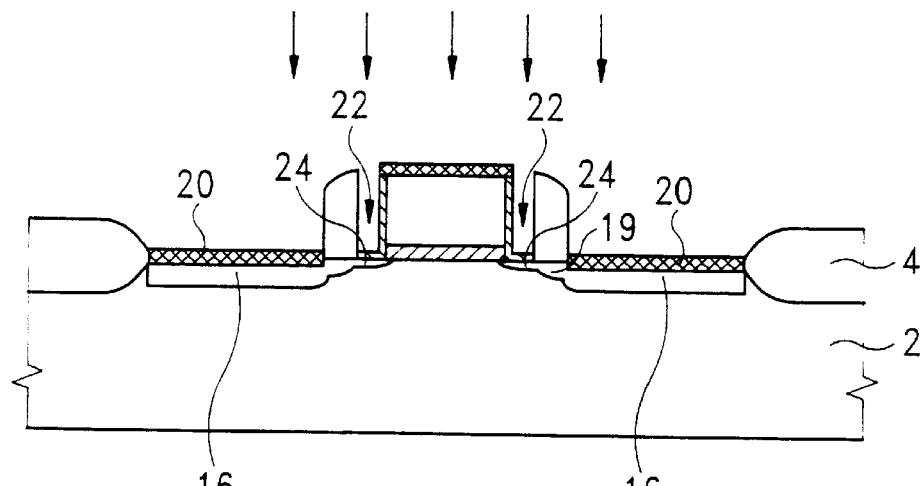
FIG. 7 is a cross-sectional view of a semiconductor wafer illustrating the step of removing the silicon nitride side-wall spacers according to the present invention.

Turning next to FIG. 7, the silicon nitride side-wall spacers 12 are removed, therefore forming air gaps 22 between the gate 8 and the side-wall spacers 18. Preferably, the silicon nitride side-wall spacers 12 can be removed by hot $H_3PO_4$ solution. Then, a low energy pocket ion implantation is performed to doped ions into the substrate 2 via the air gaps 22. Extended source and drain 24 are generated in the substrate 2 and aligned to the gate-side air gaps (GAS) 22. The dosage of the implantation is about 5E13 to 1E15 atoms/$cm^2$. The implantation energy of the step is about 0.5 to 20 KeV. The GASs 22 are used to reduce the effect of the gate fringe capacitance ($C_{FR}$).

Figure 8:
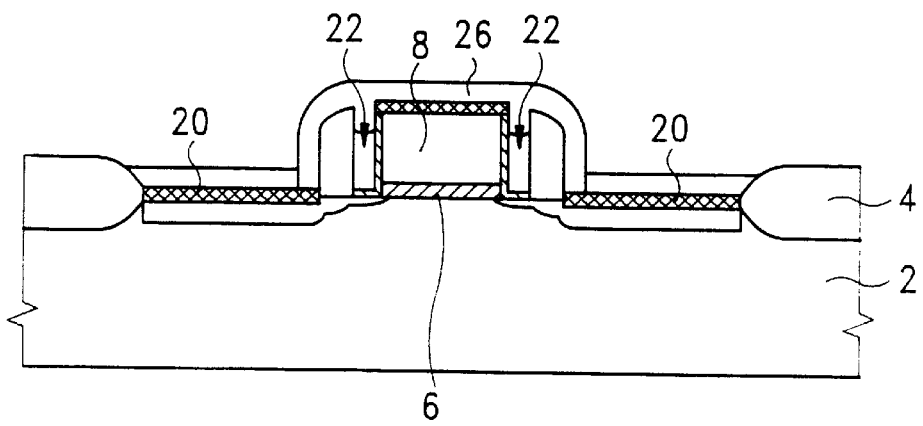
FIG. 8 is a cross-sectional view of a semiconductor wafer illustrating the step of forming a dielectric layer on the gate and the substrate according to the present invention.

Next, as can be seen by reference to FIG. 8, an oxide 26 is formed by chemical vapor deposition on the substrate 2, spacers 18 and over the gate 8. Only a portion of the oxide 26 refilled in the GASs 22 and located at the top of the gaps 22 due to the gaps 22 being too narrow. Then, a rapid thermal process (RTP) is carried out for annealing.

As shown in FIG. 8, the MOSFET includes a gate oxide 6 formed on the substrate 2. A thin dielectric layer 10, such as a silicon oxynitride layer, is formed on the side walls of the gate 8. A gate 8 is formed on the gate oxide 6. A first metal silicide layer 20 is formed on top of the gate 8 to increase the conductivity of the gate 6. Spacers 18 are formed on the substrate and separated from the gate 8 with a space. Air gaps 22 are formed between the gate 8 and the spacers 18. A portion of the dielectric layer 10 is also formed at the bottom of the air gaps 22. First doped ion regions 24 are formed aligned to the air gaps 22 in the substrate 2, and under a portion of the dielectric layer 10. Second doped ion regions 19 are formed under the spacers 18 in the substrate 2, and next to the first doped ion regions 24. Third doped ion regions 16 are formed in the substrate 2 next to the second doped ion regions 19. The third doped ion regions 16 have relatively highly doped ions to the first doped ion regions 24. The second doped ion regions 19 are formed with immediately highly doped ions between the first and the third doped ion regions 16, 24. The metal silicide layer is also formed on the third doped ion regions to increase the conductivity of the third doped ion regions. Preferably, the concentration of the first doped ion regions is about 5E17 to 5E20 atoms/$cm^3$. While the concentrations of the second and third doped ion regions are about 1E20 atoms/$cm^3$, and 1E20 to 1E21 atoms/$cm^3$, respectively.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a transistor with gate-side air gaps (GASs) on a semiconductor substrate, said method comprising the steps of:

forming a gate oxide layer on said semiconductor substrate;

forming a polysilicon layer on said gate oxide layer;

patterning said gate oxide layer and said polysilicon layer to form a gate structure;

forming a first dielectric layer on said substrate and said gate structure;

forming a second dielectric layer on said first dielectric layer;

etching said second dielectric layer to form first side-wall spacers on side walls of said gate structure, a first portion of said first dielectric layer remaining between the gate structure and said first side-wall spacers, a second portion of said first dielectric layer remaining under said first side-wall spacers;

forming a buffer layer on said substrate, said first side-wall spacers and on said gate structure, wherein said buffer layer acts as a buffer for a first ion implantation;

performing said first ion implantation to doped ions through said buffer layer into said substrate, thereby forming first doped ions regions to serve as the source and drain of said transistor;

performing an oxidation to convert said buffer layer into a doped oxide layer, and drive said ions into said substrate, second doped ion regions being generated by diffusing ions in said doped oxide into said substrate, said second doped ion regions being next to said first doped ions regions;

etching said doped oxide layer to form second side-wall spacers on said first side-wall spacers;

removing said first side-wall spacers, therefore forming said gate-side air gaps (GASs) between said gate structure and said second side-wall spacers;

performing a second ion implantation through said GASs to form third doped ion regions next to said second doped ion regions; and forming a third dielectric layer on said substrate, said second side-wall spacers and on said gate structure.

2. The method of claim 1, further including performing a rapid thermal process (RTP) after forming third dielectric layer.

3. The method of claim 1, further including forming a metal silicide layer on said first doped ion regions and on top of said gate structure after forming said second side-wall spacers.

4. The method of claim 1, wherein said first dielectric layer comprises silicon oxynitride.

5. The method of claim 4, wherein said first dielectric layer is formed by oxidation in an $N_2O$ ambient.

6. The method of claim 1, wherein said second dielectric layer comprises silicon nitride.

7. The method of claim 6, wherein said GASs are formed by removing said second dielectric layer using hot $H_3PO_4$ solution.

8. The method of claim 1, wherein said third dielectric layer comprises oxide.

9. The method of claim 1, wherein said buffer layer comprises amorphous silicon.

10. The method of claim 9, wherein said buffer layer is converted by wet oxidation at a temperature of about 700° to 1100° Centigrade.

11. The method of claim 1, wherein said first doped ion regions are formed to have a concentration of about 1E20 to 1E21 atoms/cm$^3$.

12. The method of claim 1, wherein said second doped ion regions are formed to have a concentration of about 1E20 atoms/cm$^3$.

13. The method of claim 1, wherein said third doped ion regions are formed to have a concentration of about 5E17 to 1E20 atoms/cm$^3$.

14. A method for manufacturing a transistor with gate-side air gaps (GASs) on a semiconductor substrate, said method comprising the steps of:

forming a gate oxide layer on said semiconductor substrate;

forming a polysilicon layer on said gate oxide layer;

patterning said gate oxide layer and said polysilicon layer to form a gate structure;

forming a silicon oxynitride layer on said substrate and said gate structure;

forming a silicon nitride layer on said silicon oxynitride layer;

etching said silicon nitride layer to form first side-wall spacers on side walls of said gate structure, a first portion of said silicon oxynitride layer remaining between the gate structure and said first side-wall spacers, a second portion of said silicon oxynitride layer remaining under said first side-wall spacers;

forming an amorphous layer on said substrate, said first side-wall spacers and on said gate structure, wherein said amorphous layer acts as a buffer for a first ion implantation;

performing said first ion implantation to doped ions through said amorphous layer into said substrate, thereby forming first doped ions regions to serve as the source and drain of said transistor;

performing an oxidation to convert said amorphous layer into a doped oxide layer, and drive said ions into said substrate, second doped ion regions being generated by diffusing ions in said doped oxide into said substrate, said second doped ion regions being next to said first doped ions regions;

etching said doped oxide layer to form second side-wall spacers on said first side-wall spacers;

forming a metal silicide layer on said first doped ion regions and on top of said gate structure;

removing said first side-wall spacers, therefore forming said gate-side air gaps (GASs) between said gate structure and said second side-wall spacers;

performing a second ion implantation through said GASs to form third doped ion regions next to said second doped ion regions; and forming an oxide layer on said substrate, said second side-wall spacers and on said gate structure.

15. The method of claim 14, further including performing a rapid thermal process (RTP) after forming said oxide layer.

16. The method of claim 14, wherein said silicon oxynitride layer is formed by oxidation in an $N_2O$ ambient.

17. The method of claim 14, wherein said amorphous layer is converted by wet oxidation at a temperature of about 700° to 1100° Centigrade.

18. The method of claim 14, wherein said GASs are formed by removing said silicon nitride layer using a hot $H_3PO_4$ solution.

19. The method of claim 14, wherein said first doped ion regions are formed to have a concentration of about 1E20 to 1E21 atoms/cm$^3$.

20. The method of claim 14, wherein said second doped ion regions are formed to have a concentration of about 1E20 atoms/cm$^3$.

21. The method of claim 14, wherein said third doped ion regions are formed to have a concentration of about 5E17 to 1E20 atoms/cm$^3$.

* * * * *